(12) United States Patent
Johnson

(10) Patent No.: US 7,254,509 B1
(45) Date of Patent: Aug. 7, 2007

(54) METHOD AND SYSTEM FOR TESTING A MEMORY OF A MICROPROCESSOR

(75) Inventor: Trent W. Johnson, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 86 days.

(21) Appl. No.: 11/004,265

(22) Filed: Dec. 1, 2004

(51) Int. Cl.
*G01R 27/28* (2006.01)

(52) U.S. Cl. .................. 702/117; 702/118; 702/119; 702/120

(58) Field of Classification Search .............. 702/117, 702/118, 119, 120
See application file for complete search history.

(56) References Cited

U.S. PATENT DOCUMENTS

| | | | |
|---|---|---|---|
| 4,984,239 A | 1/1991 | Suzuki et al. | |
| 5,202,889 A | 4/1993 | Aharon et al. | |
| 5,319,647 A | 6/1994 | Hosokawa et al. | |
| 5,572,666 A | 11/1996 | Whitman | |
| 5,673,425 A | 9/1997 | Iwashita | |
| 5,841,960 A | 11/1998 | Ibusuki et al. | |
| 5,867,642 A | 2/1999 | Vivio et al. | |
| 6,427,160 B1 | 7/2002 | Parks et al. | |
| 6,539,498 B1 | 3/2003 | Sato | |
| 6,567,924 B1 | 5/2003 | McGee et al. | |
| 6,654,707 B2 | 11/2003 | Wynn et al. | |
| 6,654,905 B1 | 11/2003 | Dickens | |
| 6,993,677 B1 * | 1/2006 | Wilner ............ | 714/6 |
| 2003/0066003 A1 | 4/2003 | Parvathala et al. | |
| 2003/0125908 A1 | 7/2003 | Wynn et al. | |

OTHER PUBLICATIONS

Lai, et al, "Instruction-Level DFT for Testing Processor and IP Cores in System-on-a-Chip", ACM, DAC 2001 Jun. 2001, Las Vegas, Nevada, ACM 1-58113-297-Feb. 1, 2006.

* cited by examiner

*Primary Examiner*—John Barlow
*Assistant Examiner*—Stephen J. Cherry
(74) *Attorney, Agent, or Firm*—Meyertons Hood Kivlin Kowert & Goetzel, P.C.; B. Noël Kivlin; Stephen J. Curran

(57) ABSTRACT

In one embodiment, a method may include generating a test code segment including a number of selected opcodes and executing the test code segment from a particular location within the memory for a first iteration. The method may also include saving a first test result of the execution of the test code segment after the first iteration. In addition, the method may include executing the test code segment for subsequent iterations and after each iteration of the test code segment, shifting the test code segment a predetermined number of locations from the particular location within the memory. The method may further include comparing test results of each subsequent iteration with the first test result and determining whether any of the subsequent test results are different than the first test result.

14 Claims, 10 Drawing Sheets

METHOD AND SYSTEM FOR TESTING A MEMORY OF A MICROPROCESSOR

BACKGROUND OF THE INVENTION

1. Field of the Invention

This invention relates to integrated circuit testing and, more particularly, to system level functional testing of microprocessors.

2. Description of the Related Art

Semiconductor integrated circuit (IC) devices are manufactured using many complex processing steps. In many cases, more complex ICs may require more processing steps. During any of which one or more defects may be introduced into the IC. For example, microscopic airborne particulates that find their way onto the device during manufacture may cause either latent or hard defects. Many ICs are typically manufactured on one wafer (i.e., semiconductor substrate). To reduce manufacturing defects and improve product quality and yield many manufacturers have implemented ongoing quality control in the wafer fabrication and device assembly facilities.

However, there are still a fair number of IC s that are either defective from the start or may have latent defects. Thus, device manufacturers typically test the ICs using various test strategies during the various manufacturing phases. For example, to screen out bad ICs prior to assembling the ICs into device packages, ICs may be tested while still part of the wafer. This type of testing is sometimes referred to as wafer-level test or wafer probe. In addition, since defects may be introduced during the assembly process, each IC may be tested again, after assembly, during what is sometimes referred to as production or final testing.

Production testing may take many forms depending on the various factors including customer requirements. The goal is to screen out all devices that have defects. In some cases, the ICs may be operated under various operational and environmental stresses to allow latent defects to manifest.

The type of testing performed during wafer-level and production final test typically includes the use of testing machines designed to provide necessary voltages and stimuli to the inputs of an IC. During a type of testing referred to as Functional testing, the voltages and stimuli attempts to place the device in as many operational modes as possible thereby simulating device operation. While the device is operating, the IC outputs are monitored and compared against a theoretically known good output signature that is typically stored in a test file in the tester memory. Functional testing uses a large number of test files (also referred to as test patterns) that define the stimulus and response patterns. Functional testing may generally be expected to screen a large number of defects in many fault classes.

An alternative and sometimes complementary test method used to screen defects is referred to as scan testing. Scan testing also uses test patterns. However, unlike functional testing, scan testing doesn't attempt to operate the device in all of its operational modes. Instead scan testing relies on test logic and testability features that have been designed into the IC that enable scan chains consisting of many clocked circuit elements such as flip-flops and some latches, for example, to be loaded with special test patterns. The scan chains may loaded in one mode (e.g., scan) and clocked in another mode (e.g., run). The test patterns are propagated through the IC logic. The scan patterns are clocked out of the device and compared to response patterns stored within tester memory. For certain fault classes such as stuck at faults, for example, scan testing has been known to obtain fault coverages as high as 99% and in some cases 100%.

However, regardless of the test methods used, as IC operating speeds have increased, it has been increasingly difficult to develop testing machines that can adequately operate at the required speeds. This is especially true for microprocessor testing. Testing machines that can operate at the required frequencies are very expensive. Furthermore, neither functional testing nor scan testing may screen all defects in any fault class without using enormous test patterns requiring long test durations. To obtain very high fault coverage for all fault classes, combinations of test methods may be used. For example, due to the parallel nature of superscalar microprocessor core logic, certain types of failures, such as certain speed paths, may not necessarily manifest when an IC is run through a conventional production test flow.

In addition, some ICs include embedded memory that may not be accessible (i.e. addressable) during typical functional tests. For example, microprocessors may include one or more levels of cache memory that is not user addressable memory space. To overcome this issue, some ICs include memory built-in self-test (MBIST) functionality. Conventional MBIST algorithms may implement some form of linear feedback shift register (LFSR) to generate the memory test patterns. These MBIST patterns may screen a significant number of memory defects. However, there may be data dependent defects that may be difficult to detect using MBIST or any other conventional memory tests.

SUMMARY

Various embodiments of a method and system for testing a memory of a processor are disclosed. Broadly speaking, a method for testing a memory of a processor is contemplated that includes using a test software for generating and executing a test code segment from a particular location in memory for a first iteration. The test software may also be used for saving the results of the first iteration as a golden result and comparing any subsequent results against the golden result. Further, test software may also be used for executing the test code segment for a number of subsequent iterations and after each iteration, shifting the test code segment a predetermined number of locations from the particular location within the memory. The test software may then be used for determining whether any of the subsequent results are different than the golden result.

In one embodiment, the method may include generating a test code segment including a number of selected opcodes and executing the test code segment from a particular location within the memory for a first iteration. The method may also include saving a first test result of the execution of the test code segment after the first iteration. In addition, the method may include executing the test code segment for a plurality of subsequent iterations and after each iteration of the test code segment, shifting the test code segment a predetermined number of locations from the particular location within the memory. The method may further include comparing test results of each subsequent iteration with the first test result and determining whether any of the subsequent test results are different than the first test result.

In another embodiment, the method may include generating a test code segment including a plurality of instructions, each including a number of selected opcodes. Each instruction may also include a memory reference including a memory offset, which corresponds to the start of a data segment in the memory that is used by the test code segment.

The method may also include executing the test code segment for a plurality of iterations, and after each iteration adding a predetermined value to the memory offset. In addition, the method may also include saving the data segment as a first test result of a first portion of the plurality of iterations and saving the data segment as a subsequent test result after each subsequent portion of the plurality of iterations. Further, the method may include comparing each subsequent test result with the first test result and determining whether any of the subsequent test results are different than the first test result.

Figure 1:
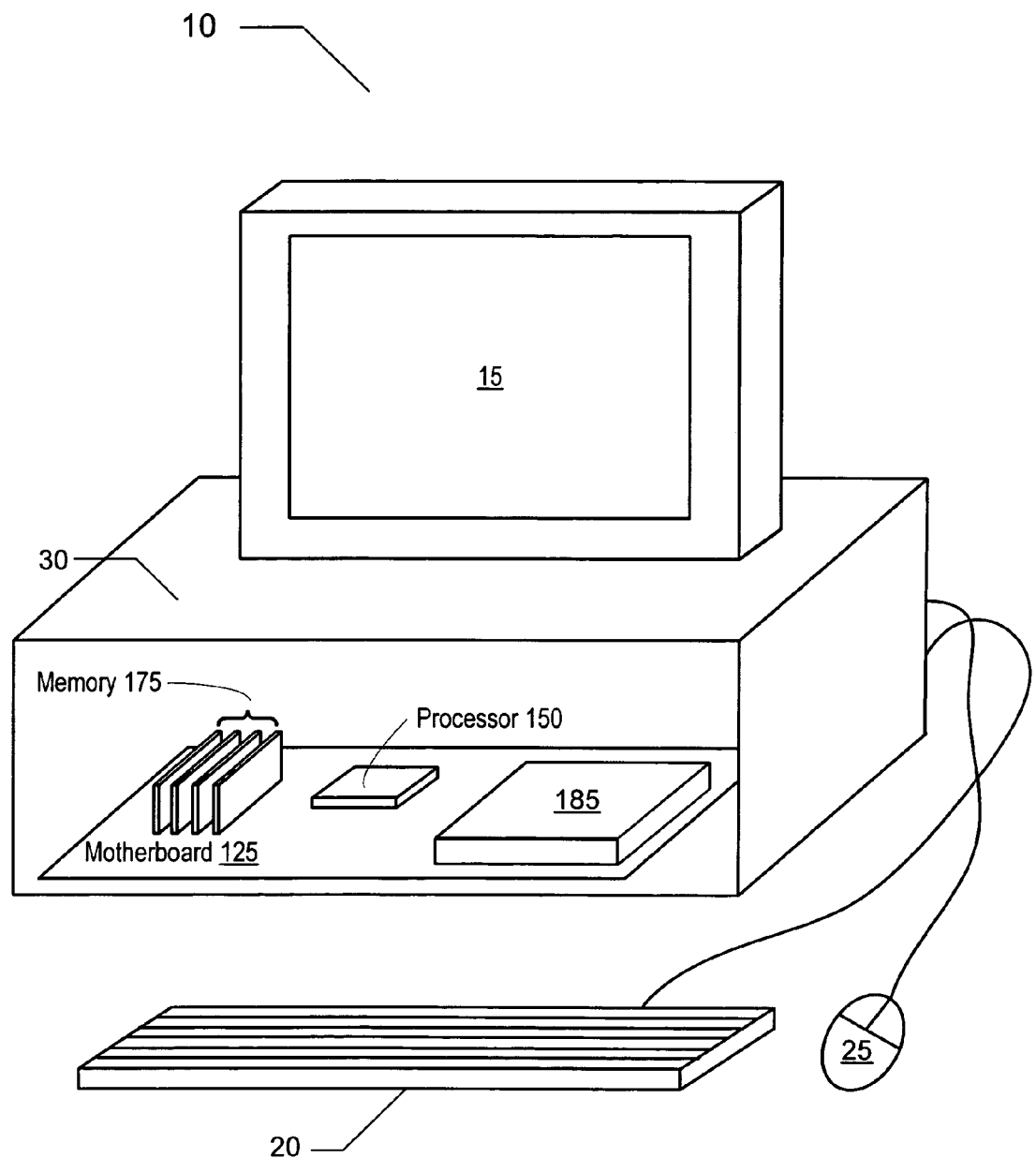
FIG. 1 is a diagram of one embodiment of a computer system used as a system level test platform for testing a processor

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include" and derivations thereof mean "including, but not limited to." The term "connected" means "directly or indirectly connected," and the term "coupled" means "directly or indirectly coupled."

DETAILED DESCRIPTION

System-Level Processor Test

As described above, conventional IC test platforms and methods may not screen out all possible defects. More particularly, in some cases certain defects may only manifest themselves when the same piece of code is executed more than once. This may be due, at least in part, to the many parallel signal paths available in superscalar processors. Accordingly, in an attempt to screen for these types of defects, after a processor is subjected to production test, for example, that processor may be tested again using a test methodology referred to as system level test. In system level test, the processor may be inserted into the motherboard of a personal computing (PC) platform. In some cases, actual customer application software may be executed. However, it may be difficult to exhaustively test the processor using a small number of customer applications and it may not be economical to use a large number of customer applications. Thus, as described below, a self-assembling test code segment may be generated randomly and run on the processor being tested. The results of the first iteration of the test code segment may be stored and used as the "gold" standard by which all other test iteration results may be measured. FIG. 1 illustrates a diagram of one embodiment of a computer system used as a system level test platform for testing a processor.

Turning now to FIG. 1, computer system 10 includes a monitor 15, a keyboard 20, and a mouse 25 each coupled to a computer housing including a motherboard 125. Motherboard 125 includes a processor 150, system memory 175 and a media drive 185. It is noted that in other embodiments computer system 10 may include other computer system components (not shown) such as a power supply, cooling fans, and peripheral, network and input/output (I/O) components, for example. These components, and others, are not shown for simplicity.

In one embodiment, processor 150 may be representative of a microprocessor implementing the x86 architecture. In other embodiments, processor 150 may be illustrative of any type of processor such as a processor in the SPARC family of processors. In still other embodiments, processor 150 may be a microcontroller that includes one or more embedded processor cores.

In one embodiment, memory 175 may be illustrative of any type of system memory including multiple memory modules, each including a number of memory devices. The memory devices may be any suitable type of memory such as memory device in the dynamic RAM (DRAM) family of devices. The memory modules may be single or dual in-line memory modules. In one embodiment, the memory modules may be removably attached to motherboard 125, although it is contemplated that in other embodiments, the memory modules may be hardwired to motherboard 125.

In the illustrated embodiment, media drive 185 may be illustrative of any type of drive such as a hard disk drive, a floppy disk drive, a random access memory (RAM) disk drive, and a compact disk read only memory (CD-ROM) drive, digital video disk (DVD) drive, or other optical drive, for example that is used to store program instructions.

Various embodiments may further include receiving, sending or storing instructions and/or data implemented in accordance with the foregoing description upon a carrier medium. Generally speaking, a carrier medium may include storage media or memory media such as memory 175 or media drive 185, for example. In addition a carrier medium may include transmission media or signals such as electrical, electromagnetic, or digital signals, conveyed via a communication medium such as network and/or a wireless link (not shown).

In the illustrated embodiment, an operating system such as Windows™ or Linux, for example, may be stored on media drive 185 and executed on processor 150. During execution, the operating system code may be copied from media drive 185 and stored in memory 175 to improve system performance. Likewise, test software used for testing processor 150 may also be stored on media drive 185 and executed on processor 150. Memory 175 may also be used by processor 150 as a temporary storage of test code and data.

As will be described in greater detail below, test software including program instructions may generate a self-assembling test code segment using a pseudo-random number generator. The test code segment may include a number of opcodes randomly selected from an opcode library. This test code segment may be executed by processor 150 multiple times. The results of the first iteration may be stored in memory. The results of each subsequent test code segment iteration is saved and compared against the results of the first iteration. If any comparison is different, the processor has failed the test.

Figure 2:
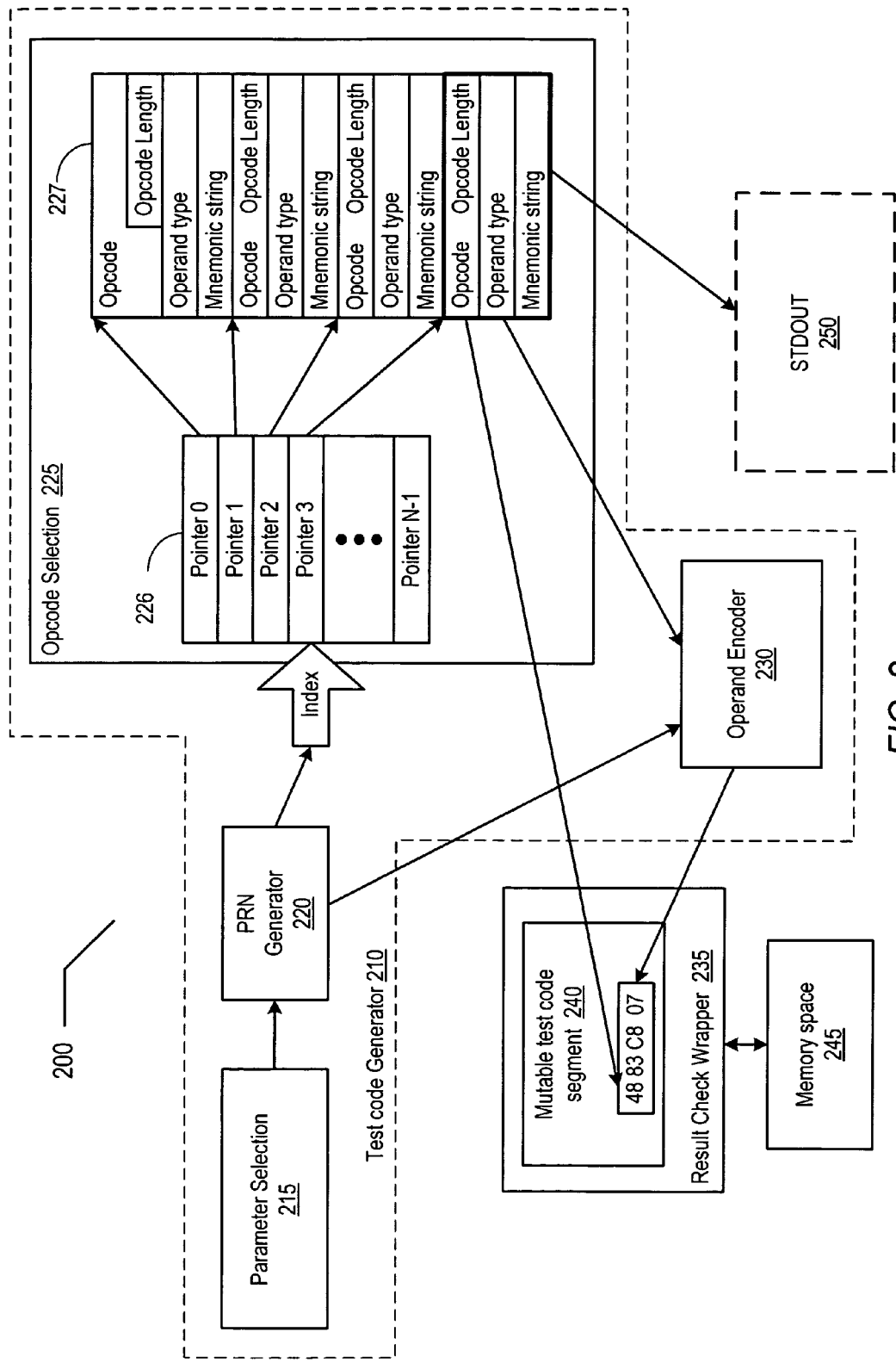
FIG. 2 is an architectural diagram of one embodiment of test software for generating and executing a test code segment on a processor.

FIG. 2 illustrates an architectural diagram of one embodiment of test software for generating and executing a test code segment on the processor of FIG. 1. Test software 200 includes a parameter selection module 215 operatively coupled to a pseudo-random number (PRN) generator 220. The PRN generator 220 is coupled to an opcode selection module 225 and to an operand encoder 230. Test software 200 also includes a mutable test code segment 240 which is functionally wrapped by a result check wrapper 235. The result check wrapper is coupled to operate within memory space 245. Further, test software 200 includes a STDOUT module 250.

In one embodiment, parameter selection module 215 may be used to set up and select certain test parameters or initial conditions such as a number of opcodes to include in test code segment 240, the legal memory space 245 usable by test code segment 240, and the number of iterations to execute test segment 240, for example. In one embodiment, test software 200, using parameter selection module 215, may prompt a user to enter test information that may be used by test software 200. For example, a user may define (the set of possible of opcodes) the range of numbers within which PRN generator 220 may be bounded, since the number of possible opcodes may set the range. Alternatively, it is contemplated that parameter selection module 215 may include a default setup which may not require user input.

In the illustrated embodiment, opcode selection module 225 includes an opcode library 227 that is coupled to a library pointer 226. In one embodiment, opcode library 227 may be used to store a set of all of the possible opcodes that may be used to create a test code segment. Opcode library 227 includes a plurality of storage locations each configured to store information corresponding to a respective opcode. More particularly, a given location may include information corresponding to the opcode, an opcode length, an operand type, and a mnemonic string that describes the opcode. It is contemplated that in other embodiments more or less information may be stored within opcode library 227. Further, library pointer 226 includes a N entries (designated 0 through N–1), each entry storing a pointer value associated with a respective location within opcode library 227. Each entry in library pointer 226 may be accessed via a corresponding index value. Thus library pointer 226 functions as a look-up table for opcode library 227.

In one embodiment, PRN generator 220 may be configured to generate a PRN which may be used as an index into library pointer 226. The entry corresponding to the index value includes a pointer value that is associated with a respective location in opcode library 227. Once an opcode library location is accessed, the information therein may be read out and used by test software 200 to generate a test code segment. For example, as described further below, the opcode may be read out and stored into the "mutable" test code segment 240. In addition, PRN generator 220 may be configured to generate a second PRN which may be used during the generation of a new operand to be used during execution of the test code segment 240. PRN generator 220 may iteratively generate a first and second PRN as many times as necessary to provide a desirable number of opcodes and operand values for creation of test code segment 240.

In one embodiment, operand encoder 230 may be configured to determine from the operand type identified in the selected opcode, what type of mask to apply to create a new operand value. A new operand value may be necessary for a given operand to ensure, for example, that only legal memory space is used during execution of the test code segment 240. Thus, operand encoder 230 may be configured to mask the second PRN bits to create a new operand value. Operand encoder 230 provide the new operand value for use by test code segment 240.

The STDOUT module 250 may be configured to provide the associated mnemonic string as an output to a display such as monitor 15 of FIG. 1 or a log file (not shown), for example.

In the illustrated embodiment, memory space 245 may be representative of the memory space within system memory 175 of FIG. 1 that may be allocated for use by test software 200 generation and execution of test segment 240.

Once test code segment 240 has been generated, test software 200 may be configured to cause the test code segment 240 to execute for a predetermined number of times on processor 150. In one embodiment, result check wrapper 235 may be configured to store and compare results of each iteration. More particularly, after the first iteration, result check wrapper 235 may store the results of the test code segment 240 within memory space 245. After each subsequent iteration of test code segment 240, result check wrapper 235 may be configured to store and compare the new results of test code segment 240 against the results of the first iteration. If the results are different, result check wrapper 235 may be configured to provide a failure notification. In addition, result check wrapper 235 may be configured to store in memory space 245 the comparison data for later use.

Figure 3:
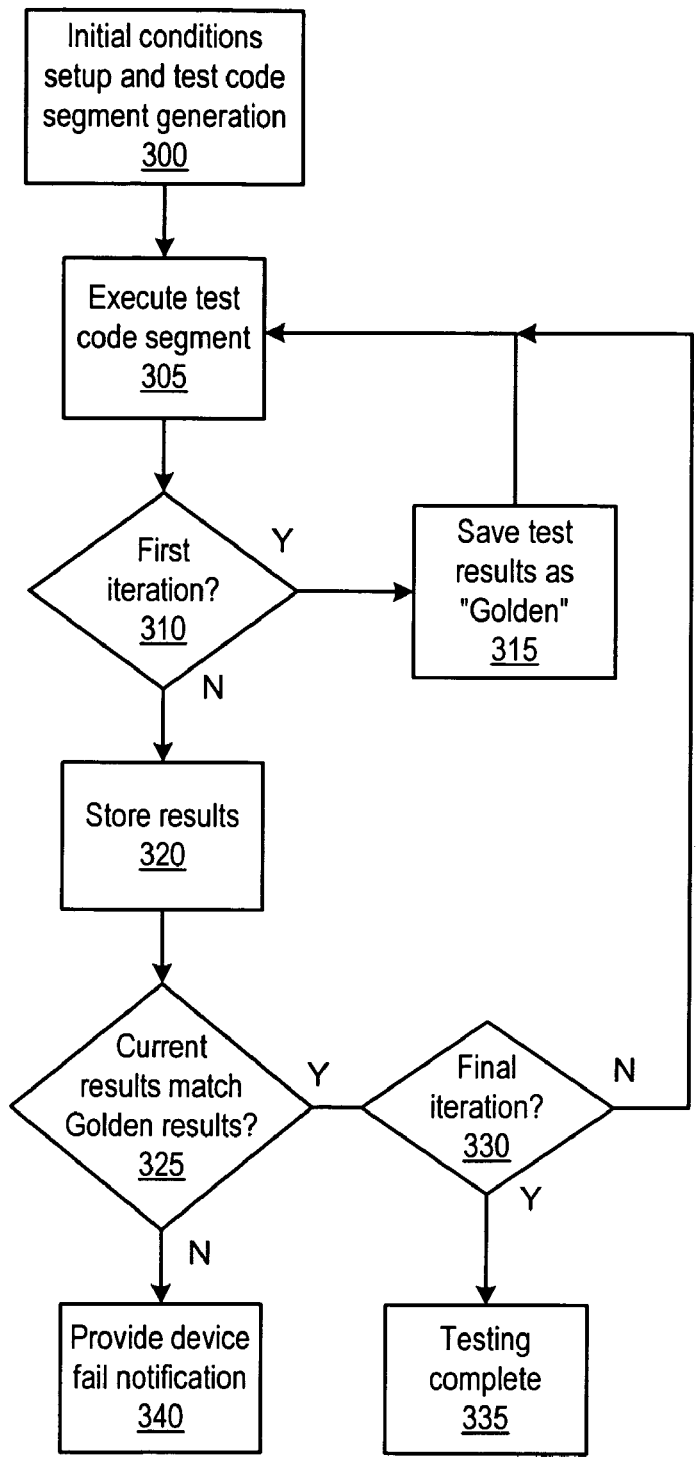
FIG. 3 is a flow diagram illustrating the iterative testing functionality of one embodiment of the test software of FIG. 2.

FIG. 3 is a flow diagram illustrating the functionality of one embodiment of the test software of FIG. 2. Referring collectively to FIG. 1 through FIG. 3, a user may load test software 200 after booting up computer system 10. As described above, in most applications it is assumed that processor 150 has enough functionality to load and execute test software 200. Once the test software 200 is loaded, test initial conditions may be set up. For example, as described above, the number of iterations of the test code segment, the number of opcodes to include in test code segment 240 may be chosen, the memory space may be allocated, and so on. The test code segment 240 may be generated and saved (block 300). It is noted that detailed aspects of block 300 such as an embodiment of the generation of the test code segment, are explained further below in conjunction with the description of FIG. 4.

Once the test code segment is generated, it may be executed by processor 150 for a given number of iterations (block 305). If the execution of test code segment 240 is the first execution (block 310), the results may be saved by storing them within memory space 245 (block 315). In one embodiment, the test results may include a dump of all processor registers into result variables. These result variables are stored in within memory space 245. These first iteration results are referred to as the "Golden" results as they are the standard against which all other results will be compared. Operation then proceeds back to block 305 where test code segment 240 is executed again.

Referring back to block 310, if the execution of test code segment 240 is not the first execution, the results may be saved by storing them within memory space 245 (block 320). Result check wrapper 235 may compare the current results with the Golden results of the first iteration (block 325). If the results do not match, test software 200 may provide a failure notification to the user for example (block 340). In one embodiment, the test may terminate, while in other embodiments, the user may choose to allow the test to continue while logging the results. It is noted that in other embodiments, the results of each iteration may not be saved, and just compared against the golden result. In such embodiments block 320 may be omitted.

However, if the results match (block 325), test software 200 may check initial conditions and if the current test execution is the final iteration (block 330), the testing is complete (block 335). If the current test execution is not the final iteration (block 330) operation proceeds as described above in block 305, where the test code segment 240 is executed again.

In one embodiment, upon completion of testing, result check wrapper 235 may be configured to save all results (e.g., in a log file) to a more permanent storage such as media drive 185, for example.

Test Code Segment Generation

Figure 4:
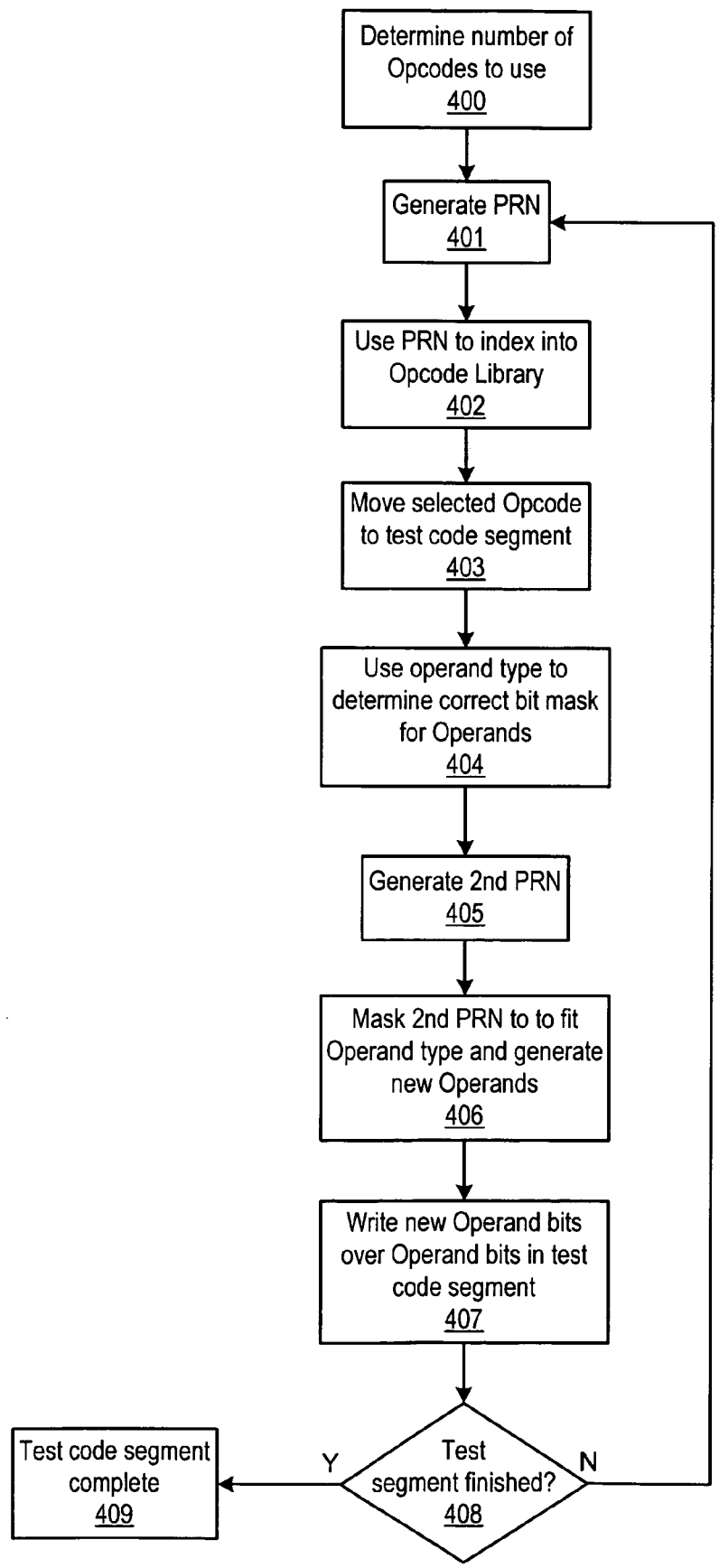
FIG. 4 is a flow diagram illustrating further aspects of the functionality of one embodiment of the test software of FIG. 2.

FIG. 4 is a flow diagram illustrating further aspects of the functionality of one embodiment of the test software of FIG. 2. More particularly, the generation of a test code segment such as test code segment 240 is described in further detail. Referring collectively to FIG. 1, FIG. 2 and FIG. 4, in one embodiment, parameter selection module 215 may be used to set up and select certain test parameters or initial conditions such a number of opcodes in the set of possible opcodes (block 400). As describe above, the information entered using the parameter selection module 215 may be used by test software 200 to define the range of numbers within which PRN generator 220 may be bounded. For example, if there are 100 possible opcodes stored within opcode library 227, then the range of numbers may be 0-99. Once the initial information is entered, PRN generator 220 may generate a PRN within the specified range (block 401). The PRN may be used to index into opcode library 227 (block 402). In one embodiment, the index value may be used to access a particular entry in pointer look-up table 226. The pointer value stored at the particular entry is used to access a corresponding entry within opcode library 227.

As described above, in one embodiment, each entry of opcode library 227 may include an opcode value, an opcode length, an operand type, and a mnemonic string that describes the opcode. Once an opcode library location is accessed, the information therein may be read out and used by test software 200 to generate a test code segment. In one embodiment, the selected opcode may be read out and stored into the test code segment 240 (block 403). In one embodiment, an end of instruction pointer may be used to identify where, in test code segment 240, to place the next selected opcode.

Figure 5:
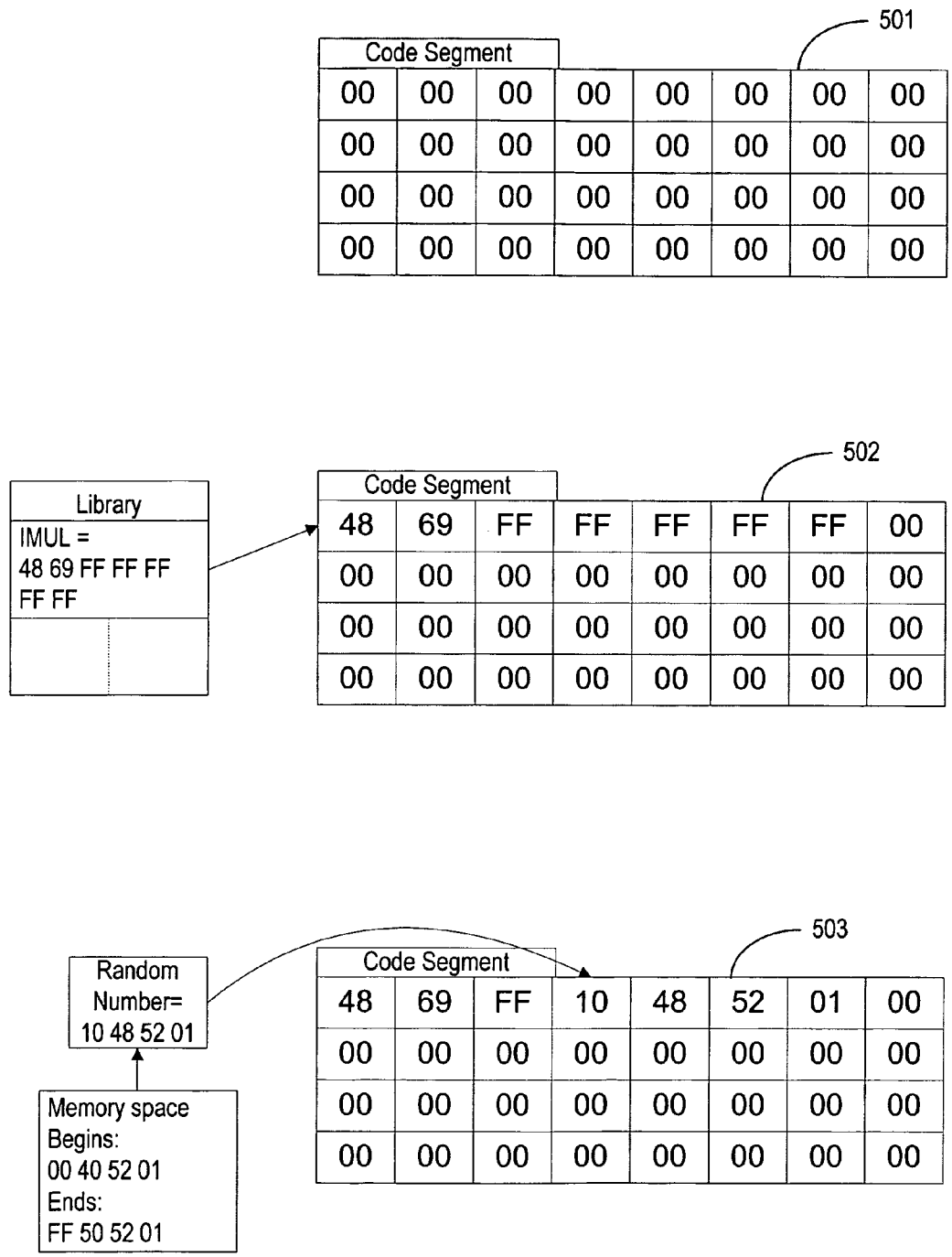
FIG. 5 is a diagram that illustrates one embodiment of the generation of a test code segment.

In one embodiment, operand encoder 230 may use the operand type identified in the selected opcode to determine a correct bit mask to apply when creating a new operand for use when executing the opcode (block 404). PRN generator 220 may generate a second PRN which may be used during the generation of a new operand to be used during execution of the test code segment 240 (block 405). Operand encoder 230 may apply the mask to the second PRN bits to create a new operand value (block 406). Operand encoder 230 provides the new operand value for use by test code segment 240 by writing the new operand value over the existing operand value (block 407). FIG. 5 illustrates the generation of an exemplary test code segment described above in blocks 403 through 407.

Test software 200 checks to see if generation of the test code segment is complete (block 408). In one embodiment, a counter and compare scheme may be used to determine if PRN generator has been executed a predetermined number of times. I another embodiment, the counter may keep track of the number of opcodes in test segment 240. For example, there may be 100 opcodes in opcode library 227. If PRN generator 220 is executed 100 times, there may be a smaller number opcodes actually used in test code segment 240. Since it is possible to duplicate opcodes when randomly generating opcodes, in one embodiment, the duplicate opcodes may not be used. Accordingly, it is contemplated that any scheme may be used when determining when test code segment 240 is ready for execution.

If test code segment 240 is not ready (block 408), operation proceeds back to block 401 where another PRN is generated to get another opcode. This process may be repeated until test code segment 240 is complete (block 409) and ready for execution by test software 200.

FIG. 5 further illustrates the generation of a portion of a test code segment including the replacement of the operand. Test code segment 501 is illustrative of a test code segment (e.g., test code segment 240) in memory that may be in an initialized state prior to any opcodes being stored therein.

Test code segment 502 is illustrative of the test code segment after an operand has been selected from the opcode library and stored in test code segment. As shown to the left of test code segment 502, an IMUL instruction includes an opcode of "48 69 FF FF FF FF FFh". The last four bytes in the opcode (e.g., the FFh values) may be representative of an operand template that may be any value. For example, as described above, the operand type may determine the masking for the operand value. In the illustrated embodiment, depending on the operand type any or all of the operand bytes may be overwritten.

Test code segment 503 is illustrative of a test code segment after a second PRN is generated and used to create an operand. In the illustrated embodiment, an operand of 10 48 52 01h was generated and a portion of the operand bits was overwritten. One byte was left untouched (FFh). Thus, in the illustrated embodiment, the four bytes 10 48 52 01h may represent a memory location in an exemplary memory range such as 00 40 52 01h through FF 50 52 01h.

System Level Test and Debug

The above descriptions discuss embodiments of a system level test of a processor and detecting a failure. In another embodiment, when the results of any subsequent iteration do not match the results of the first iteration and a failure is detected, instead of just providing a failure notification, additional test iterations may be performed in an attempt to determine the cause (i.e., which opcode(s) caused) of the failure. The additional test iterations may be performed using reduced sets of possible opcodes until the opcodes have been narrowed down to a small number of opcodes that may be the cause of the failure. In this way, a suitable smaller number of opcodes that may be causing the failure may be provided without user intervention. This smaller list of opcodes may be used to more easily determine which circuits have defects.

Figure 6:
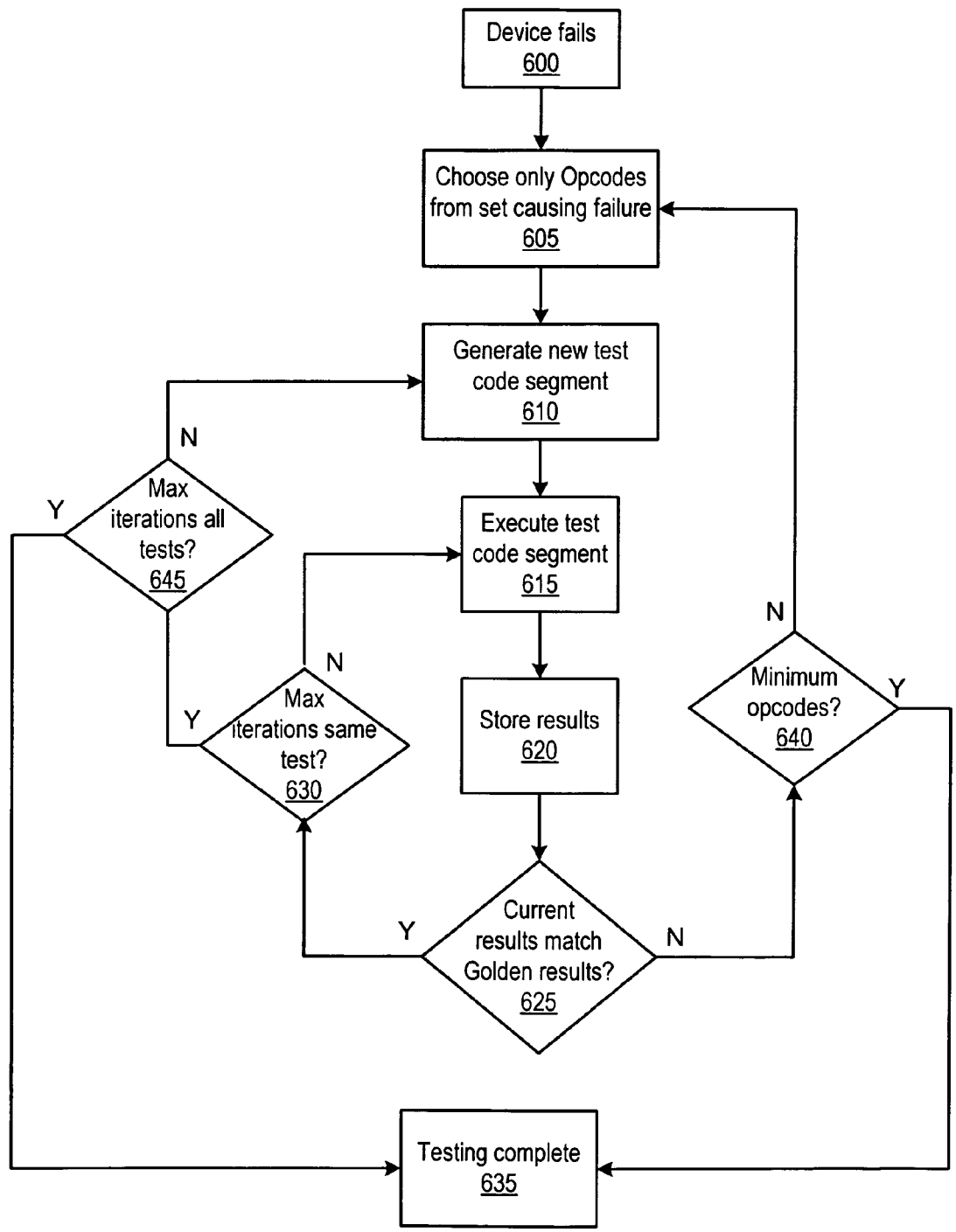
FIG. 6 is a flow diagram that illustrates the debug functionality of another embodiment of the test software of FIG. 2.

FIG. 6 is a flow diagram that illustrates the functionality of another embodiment of the test software described above. Referring collectively to FIG. 2 through FIG. 6, a failure is detected during an iteration of a system level test such as the test sequence described above in FIG. 3 (block 600). In response to detecting the failure, test software 200 may be configured to produce a new set of possible opcodes from which to choose to generate a new test code segment (block 605). The new set of possible opcodes may be a set of constituent opcodes from the test code segment that produced the failure.

In one embodiment, test software 200 may keep track of which opcodes were used as the set of constituent opcodes by using an array. Each element in the array may represent an index into the opcode library. In one implementation, the value stored in each array position is indicative of whether the corresponding opcode was used in the test code segment. In one embodiment, using a method similar to the method described above in conjunction with FIG. 4, a new test code segment may be generated by iteratively using PRN generator 220 with the new set of possible opcodes (block 610). Once the new test code segment is generated, test software 200 executes the new test code segment (block 615) and store the results of the execution (block 620). The results are compared with the Golden results saved from the first iteration of the original test code segment. If the results do not match (block 625), the failure mode has been duplicated and the number of opcodes may be reduced again. In one embodiment, test software 200 may check if a minimum number of opcodes has been reached and if so, testing and debug is complete (block 635). However, if the minimum number of opcodes has not been reached, further test iterations with fewer opcodes may be performed and operation proceeds as described above in block 605. It is noted that a minimum number of opcodes may be programmed by a user, or alternatively a default minimum number of opcodes may be used. It is further noted that an alternative embodiment is contemplated in which any method may be used to generate the new test code segment. It is also noted that in other embodiments, the results of each iteration may not be saved, and just compared against the golden result. In such embodiments block 620 may be omitted.

Referring back to block 625, if the current results match the Golden results, then the failure has gone away and additional test iterations may be performed. Test software 200 may determine if a maximum number of test iterations has been reached for the same test code segment (block 630). For example, in one embodiment a user may set up a maximum number of iterations to execute the current new test code segment without a failure before trying a different new test code segment. If the maximum number of test iterations has not been reached, operation proceeds as described above in block 615, where the current test code segment is executed again.

If the maximum number of test iterations for the current new test code segment has been reached, test software 200 may determine if a maximum number of test iterations has been reached for all test code segments (block 645). In one embodiment, a user may set up a maximum number of iterations to execute all test code segments without a failure before the testing is stopped. If the maximum number of iterations for all test code segments has not been reached, a different new test code segment may be generated as described above in block 610. Since the goal of the test is to reproduce the failure, this different test code segment may be generated using the same set of possible opcodes used to generate the current test code segment. However, the opcodes selected may be different due to the use of a PRN.

Referring back to block 645, if the maximum number of iterations for all test code segments has been reached, testing may be stopped. In this case, it may be possible that the opcode sequence used to create the failure is the only sequence that does so, in which case additional test code segments with different opcodes may not yield further failures.

Memory Test During System-Level Test

Figure 8:
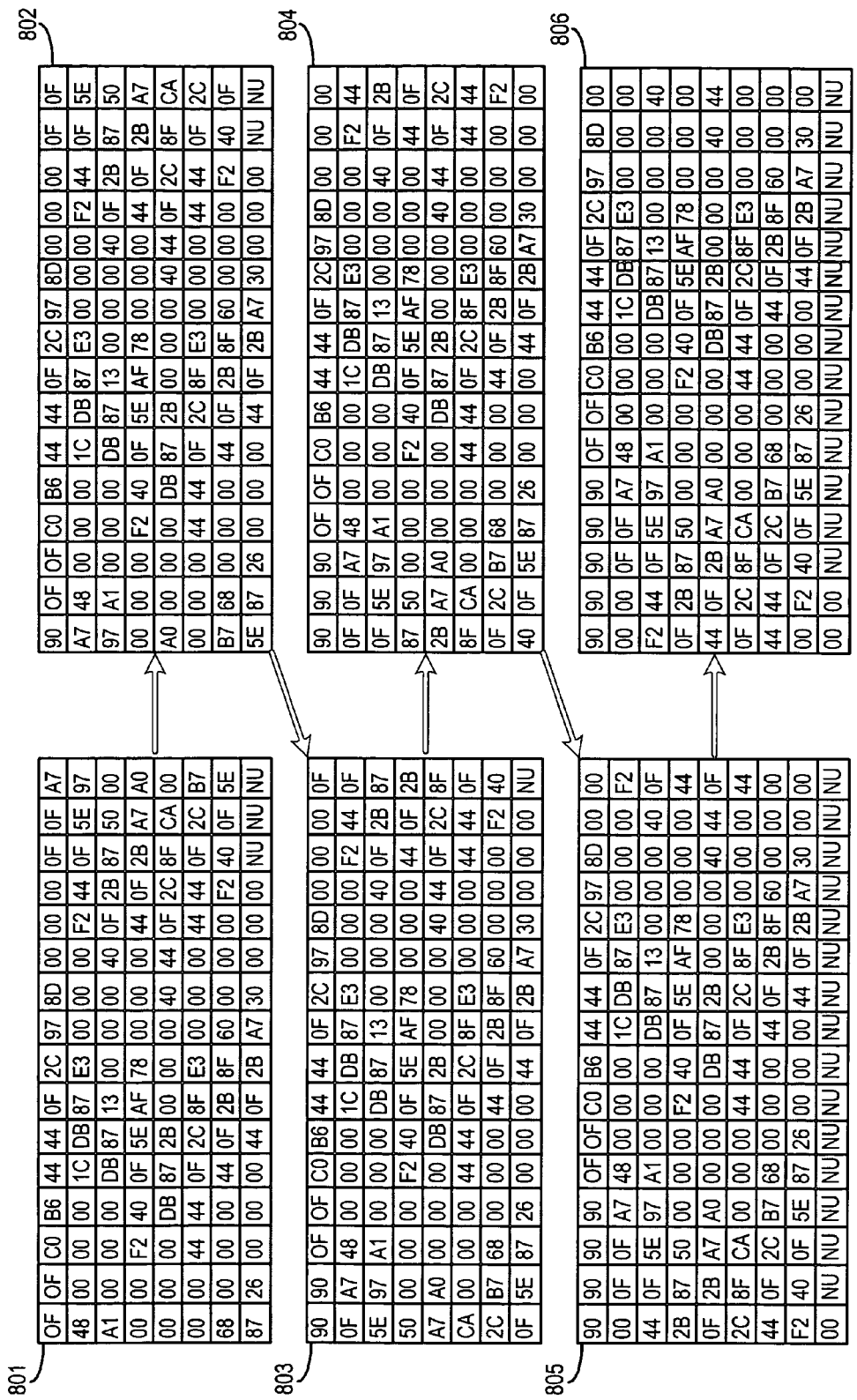
FIG. 8 is a diagram illustrating a portion of a test code segment being shifted through a memory.

As described above during system-level test, memory embedded within a processor such as an instruction cache memory, for example, may not be user addressable. In one embodiment, to detect defects in the embedded memory a test code segment (e.g., test code segment 240) may be generated and stored in the memory. The test code segment may be iterated multiple times. However before each new iteration, the test code segment may be moved a predetermined number of memory locations. In FIG. 8, a test code segment is stored in a memory region. The test code segment is shifted before each new iteration of the test code segment.

Figure 7:
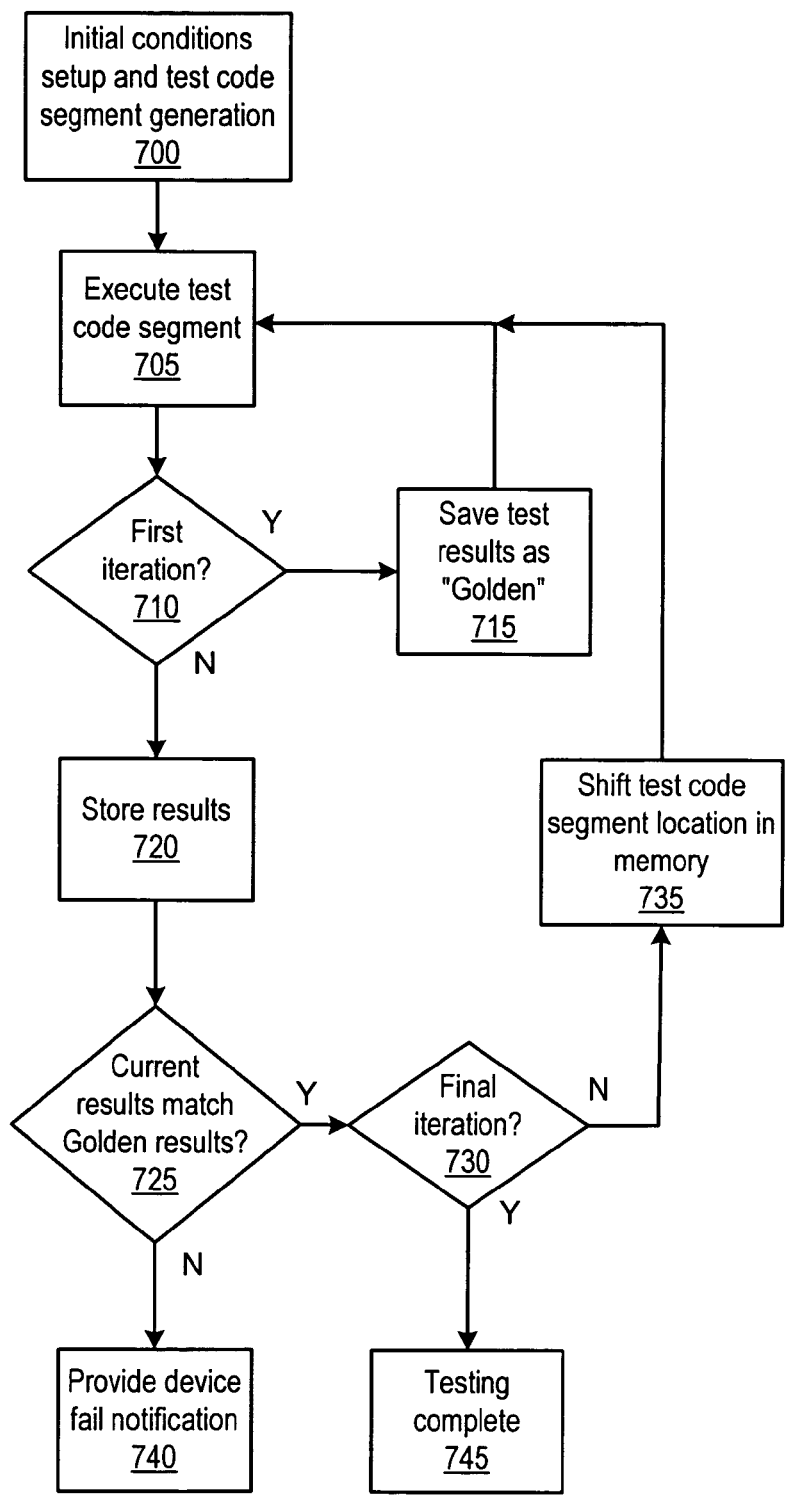
FIG. 7 is a flow diagram illustrating the memory testing functionality of another embodiment of the test software of FIG. 2

FIG. 7 is a flow diagram illustrating the functionality of another embodiment of the test software of FIG. 2. Referring collectively to FIG. 1 through FIG. 5 and FIG. 7, a user may load test software 200 after booting up computer system 10. Similar to the description of FIG. 3 above, in most applications it is assumed that processor 150 has enough functionality to load and execute test software 200. Once the test software 200 is loaded, test initial conditions may be set up. For example, as described above, the number of iterations of the test code segment, the number of opcodes to include in test code segment 240 may be chosen, the memory space may be allocated, and so on. The test code segment 240 may be generated and loaded into a memory such as an instruction cache memory (not shown) within processor 150, for example, using an indexed offset (block 700). It is noted that detailed aspects of block 700 such as an embodiment of the generation of the test code segment, are explained above in conjunction with the description of FIG. 4. However, it is contemplated that in other embodiments any method of generating the test code segment may be used.

Once the test code segment is generated and loaded, it may be executed by processor 150 for a given number of iterations (block 705). If the execution of test code segment 240 is the first execution (block 710), the results may be saved by storing them within memory space 245 (block 715). In one embodiment, the test results may include a dump of all processor registers into result variables. These result variables are stored in within memory space 245. These first iteration results are referred to as the "Golden" results as they are the standard against which all other results will be compared. Operation then proceeds back to block 705 where test code segment 240 is executed again.

Referring back to block 710, if the execution of test code segment 240 is not the first execution, the results may be saved by storing them within memory space 245 (block 720). Result check wrapper 235 may compare the current results with the Golden results of the first iteration (block 725). If the results do not match, test software 200 may provide a failure notification to the user for example (block 740). In one embodiment, the test may terminate, while in other embodiments, the user may choose to allow the test to continue while logging the results. It is noted that in other embodiments, the results of each iteration may not be saved, and just compared against the golden result. In such embodiments block 720 may be omitted.

However, if the results match (block 725), test software 200 may check initial conditions and if the current test execution is the final iteration (block 730), the testing is complete (block 745). If the current test execution is not the final iteration (block 730) the test code segment is shifted in the memory by a predetermined number of locations using an offset (block 735). More particularly, in one embodiment, the test code segment may be reloaded into the memory using the indexed offset. However, for the subsequent iterations of the test code segment, the indexed offset may be incremented by a predetermined number prior to loading the test code segment into memory. Once the test code segment has been shifted (i.e., reloaded with an incremented indexed offset), operation proceeds as described above in block 705, where the test code segment 240 is executed again.

In one embodiment, upon completion of testing, result check wrapper 235 may be configured to save all results (e.g., in a log file) to a more permanent storage such as media drive 185, for example.

Referring now to FIG. 8, a diagram that illustrates an embodiment of a portion of a test code segment being shifted in a memory is shown. More particularly, in the illustrated embodiment each of the six boxes (designated 801 through 806) may be representative of a memory image of a cache line during a given iteration of the test code segment stored within the memory. At the top left of box 801, which includes eight rows of 16 bytes or 128 bytes, the test code segment (e.g., test code segment 240) begins with a 0Fh. The test code segment ends at the last 00h in the last row. The locations designated NU are "Not Used."

As described above, the test code segment is loaded into the memory as represented in box 801. After the first iteration, the same test code segment may be reloaded into the memory, but with an incremented indexed offset. This memory image is shown in box 802. In this instance the test code segment was shifted on location. In addition, the opcode for a "nop" instruction (represented by a 90h) is loaded into the location vacated by the shifted code. For example the top left location of box 802 now has a 90h stored therein.

Further, after each iteration the same test code segment may be shifted in memory using an incremented indexed offset and the preceding vacated locations are filled with 90h. This is illustrated in the remaining boxes 803 through 806.

Depending on the number of iterations performed, the test code segment may be shifted through multiple boundaries (e.g., cache line boundaries) thereby placing possibly sensitive code on a boundary with a data-specific sensitivity. Doing so, may allow a test code segment executing within an operating system during a system-level test to induce data-specific errors with more frequent success than conventional testing techniques.

In another embodiment, another memory test may be performed using a method similar in some aspects to the method described above. However, in the following description of FIG. 9, a memory segment may be tested by executing the same test code segment multiple times, but changing a memory offset that points to the start of data used by the test code segment in the memory. In one embodiment, the rdi register may be used as a memory offset for instructions with memory references. For discussion purposes, an exemplary test code segment is shown below.

CVTTSS2SI 0000008D(%rdi), %r10d
PF2IW %mm4, 00000048(%rdi)
FILD (long)000000E3(%rdi)
DIVSD 000000A1(%rdi), %xmm10
FILD (long)00000013(%rdi)
MOVNTPS 00000050(%rdi), %xmm0
DIVSD 00000078(%rdi), %xmm5
MOVNTPS 000000A0(%rdi), %xmm12
FILD (long)0000002B(%rdi)
CVTTSS2SI 000000CA(%rdi), %ecx
CVTTSS2SI 000000A3(%rdi), %r9d
CVTTSS2SI 00000068(% di), %r14d
MOVNTPS 00000060(%rdi), %xmm9
DIVSD 00000026(%rdi), %xmm0
MOVNTPS 00000030(%rdi), %xmm12

In the test code segment above, each memory reference includes a memory offset by the value in the rdi register. After each iteration of the above test code segment the rdi value may be incremented or offset by a predetermine value. In the example shown in FIG. 10, the offset value in the rdi register is incremented by four. By using a memory offset that is different for each execution of the test code segment, the data stored at a given referenced location may be preserved from the previous iteration. As described in greater detail below, once a predetermined number of test code iterations have completed, the memory segment may be saved as a Golden result, to which any other results may be compared.

Figure 9:
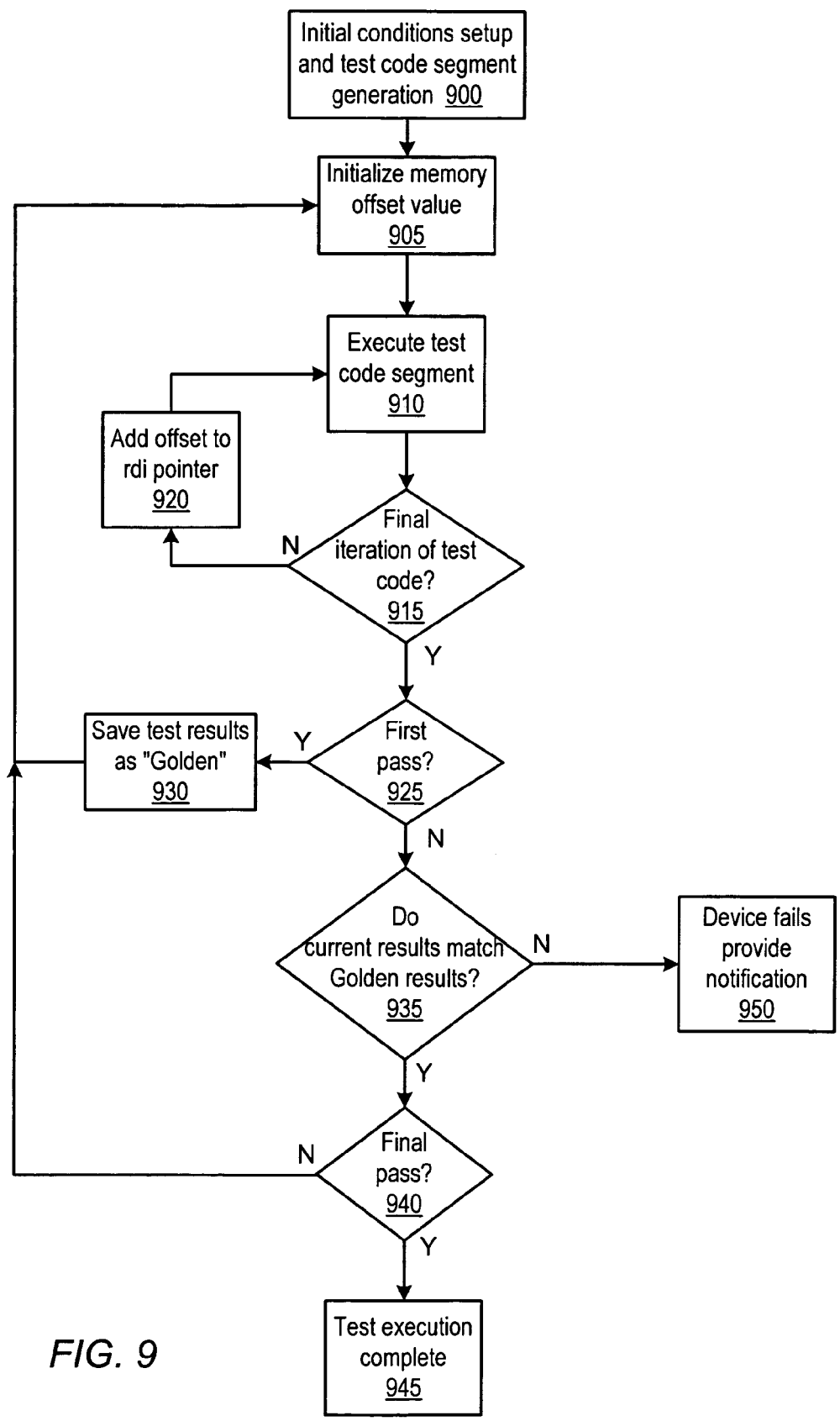
FIG. 9 is a flow diagram that illustrates the memory testing functionality of another embodiment of the test software FIG. 2.

FIG. 9 is a flow diagram illustrating the functionality of another embodiment of the test software of FIG. 2. Referring collectively to FIG. 1 through FIG. 5 and FIG. 9, a user may load test software 200 after booting up computer system 10. Once the test software 200 is loaded onto processor 150, test initial conditions may be set up. For example, as described above, the number of iterations of the test code segment, the number and type of opcodes to include in test code segment 240 may be chosen, the memory space may be allocated, memory offset increment value may be initialized, and so on. The test code segment 240 may be generated and loaded into a memory such as memory 175 within processor 150, for example (block 900). It is noted that detailed aspects of block 900 such as an embodiment of the generation of the test code segment, are explained above in conjunction with the descriptions of FIG. 4 and FIG. 5. However, it is contemplated that in other embodiments any method of generating the test code segment may be used.

In addition, a value stored in a general-purpose register such as the rdi register may be initialized to a value such as zero, for example (block 905). It is noted that the rdi register may also be referred to as the edi register in processors implemented using the x86 architecture and having 32 bits or less. It is further noted that in other embodiments, for processors implemented using architectures other then x86, it is contemplated that other general-purpose registers may be used.

Once initialized, the test code segment may be executed (block 910). In one embodiment, the rdi value may be zero for the first iteration of the test code segment. Thus, a set of data values may be stored in the memory segment allocated for use by the test code segment. If this is not the final iteration of the test code segment (block 915), the test software may add an offset value to the rdi register value (block 920). Operation continues in block 910 where the test code segment is executed again. These iterations may continue for a predetermined number of iterations. In one embodiment, a counter such as a loop counter, for example, may be used to track the number of iterations.

If however, the final iteration is executed (block 915), test software 200 determines if this is the first pass of a given number of iterations (block 925). If this is the first pass, the results of this pass of test code iterations are saved as "Golden" as described above (block 930). Once the results are saved, operation proceeds back to block 905 where the rdi value may be reinitialized and the test code segment is executed (block 910).

Referring back to block 925, if this is not the first pass, in one embodiment, test software 200 may check the current results against the first pass results to determine if the current results are the same as the first pass results (block 935). If the current results are not the same as the first pass (i.e., Golden) results, then the processor has failed the test and in one embodiment, a failure notification may be provided (block 950). If the current results match the golden results (block 935), test software 200 determines whether this is the final pass of test code segment iterations. If this is not the final pass (block 940), operation proceeds as described above where the rdi value may be reinitialized (block 905) and the test code segment is executed (block 910).

However, if this is the final pass (block 940), in one embodiment, testing is complete (block 945). It is noted that in alternative embodiments, the results checking may be done as a post-processing step.

Figure 10:
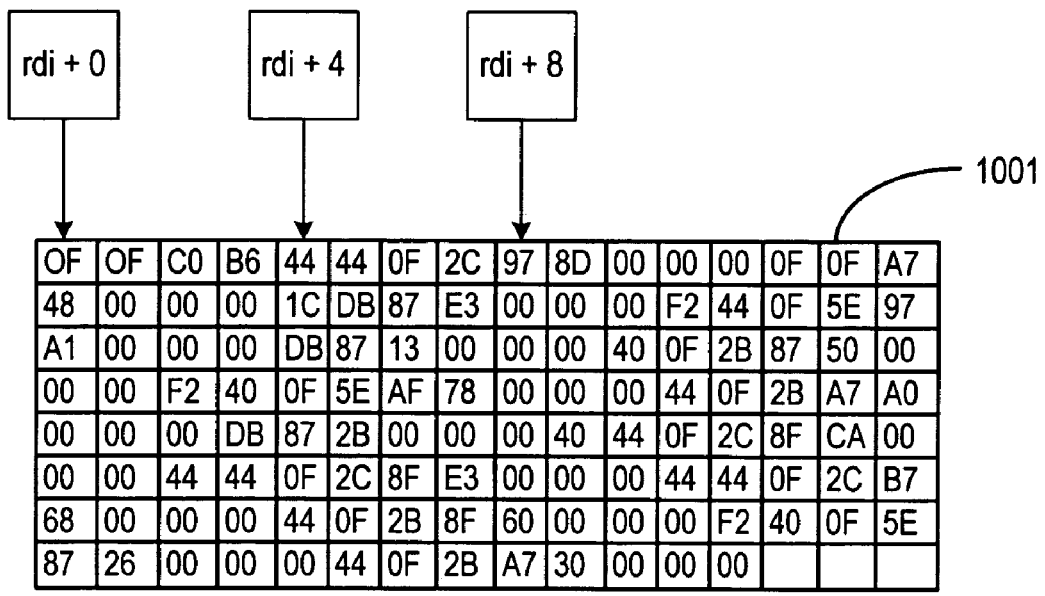
FIG. 10 a diagram illustrating an embodiment of a memory offset stepping through a memory segment including data used by a test code segment.

Turning to FIG. 10, a diagram that illustrates an embodiment of a memory offset stepping through a memory segment that includes data used by a test code segment is shown. Memory segment 1001 is representative of any portion of memory that is allocated for use by test code segment 240. As described above in conjunction with the description of FIG. 9, a general-purpose register such as the rdi register may be used as a memory offset for memory references. In the illustrated embodiment, the location pointed to by the memory offset corresponds to the start of the data segment used by the test code segment. In one embodiment, the memory offset (e.g., rdi) is changed for each iteration of the test code segment in a give test iteration pass. For example, during a first iteration the rdi value may be zero and during the two subsequent iterations, the rdi values may be rdi +4 and rdi +8, respectively.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method for testing a memory of a processor, said method comprising:
   generating a test code segment including a number of selected opcodes;
      wherein generating the test code segment includes:
         storing a set of possible opcodes in a plurality of storage locations;
         iteratively generating a pseudo-random value; and
         after each iteration, using the resulting pseudo-random value to select an opcode from the set of possible opcodes until a number of opcodes have been selected;
   executing the test code segment from a particular location within the memory for a first iteration;
   saving within the memory, a first test result of the execution of the test code segment after the first iteration;
   executing the test code segment for a plurality of subsequent iterations and after each iteration of the test code segment, shifting the test code segment a predetermined number of locations from the particular location within the memory;
   comparing test results of each subsequent iteration with the first test result;
   determining whether any of the subsequent test results are different than the first test result; and
   providing a failure notification in response to determining that any of the subsequent test results are different than the first test result.

2. The method as recited in claim 1, wherein generating the test code segment further includes generating a second pseudo-random value for use in generating a new operand value used during execution of the test code segment.

3. The method as recited in claim 2, wherein the test code segment is self-assembling such that the generating and executing of the test code segment is performed by the processor.

4. A carrier medium including program instructions which when executed by a processor implement a method comprising:
   generating a test code segment including a number of selected opcodes;
      wherein generating the test code segment includes:
         storing a set of possible opcodes in a plurality of storage locations;
         iteratively generating a pseudo-random value; and
         after each iteration, using the resulting pseudo-random value to select an opcode from the set of possible opcodes until a number of opcodes have been selected;
   executing the test code segment for a plurality of iterations;
   saving a first test result of the execution of the test code segment after a first iteration;
   comparing additional test results of each subsequent iteration with the first test result; and
   providing a failure notification in response to determining that any of the subsequent test results are different than the first test result.

5. The carrier medium as recited in claim 4, wherein the method further comprises generating a second pseudo-random value for use in generating an operand value used during execution of the test code segment.

6. A system comprising:
   a processor;
   a memory for storing program instructions executable by the processor to implement the method comprising:
      a generating a test code segment including a number of selected opcodes;
         wherein generating the test code segment includes:
            storing a set of possible opcodes in a plurality of storage locations;
            iteratively generating a pseudo-random value; and
            after each iteration, using the resulting pseudo-random value to select an opcode from the set of possible opcodes until a number of opcodes have been selected;
      executing the test code segment for a plurality of iterations;
      saving a first test result of the execution of the test code segment after a first iteration;
      comparing additional test results of each subsequent iteration with the first test result; and
      providing a failure notification in response to determining that any of the subsequent test results are different than the first test result.

7. The system as recited in claim 6, wherein the method further comprises generating a second pseudo-random value for use in generating an operand value used during execution of the test code segment.

8. A method for testing a memory of a processor, said method comprising:
- generating a test code segment including a plurality of instructions, each including a number of selected opcodes, wherein each instruction further includes a memory reference including a memory offset, wherein the memory offset corresponds to the start of a data segment in the memory that is used by the test code segment;
  - wherein generating the test code segment includes:
    - storing a set of possible opcodes in a plurality of storage locations:
    - iteratively generating a pseudo-random value; and
    - after each iteration, using the resulting pseudo-random value to select an opcode from the set of possible opcodes until a number of opcodes have been selected;
- executing the test code segment for a plurality of iterations, and after each iteration of the plurality of iterations adding a predetermined value to the memory offset;
- saving within the memory, the data segment as a first test result of a first portion of the plurality of iterations;
- saving the data segment as a subsequent test result after each subsequent portion of the plurality of iterations;
- comparing each subsequent test result with the first test result;
- determining whether any of the subsequent test results are different than the first test result; and
- providing a failure notification in response to determining that any of the subsequent test results are different than the first test result.

9. The method as recited in claim 8, wherein generating the test code segment further includes generating a second pseudo-random value for use in generating a new operand value used during execution of the test code segment.

10. The method as recited in claim 9, wherein the test code segment is self-assembling such that the generating and executing of the test code segment is performed by the processor.

11. A carrier medium including program instructions which when executed by a processor implement a method comprising:
- generating a test code segment including a plurality of instructions, each including a number of selected opcodes, wherein each instruction further includes a memory reference including a memory offset, wherein the memory offset corresponds to the start of a data segment in the memory that is used by the test code segment;
  - wherein generating the test code segment includes:
    - storing a set of possible opcodes in a plurality of storage locations;
    - iteratively generating a pseudo-random value; and
    - after each iteration, using the resulting pseudo-random value to select an opcode from the set of possible opcodes until a number of opcodes have been selected;
- executing the test code segment for a plurality of iterations, and after each iteration of the plurality of iterations adding a predetermined value to the memory offset;
- saving within the memory, the data segment as a first test result of a first portion of the plurality of iterations;
- saving the data segment as a subsequent test result after each subsequent portion of the plurality of iterations;
- comparing each subsequent test result with the first test result;
- determining whether any of the subsequent test results are different than the first test result; and
- providing a failure notification in response to determining that any of the subsequent test results are different than the first test result.

12. The carrier medium as recited in claim 11, wherein the method further comprises generating a second pseudo-random value for use in generating an operand value used during execution of the test code segment.

13. A system comprising:
- a processor;
- a memory for storing program instructions executable by the processor to implement the method comprising:
  - generating a test code segment including a plurality of instructions, each including a number of selected opcodes, wherein each instruction further includes a memory reference including a memory offset, wherein the memory offset corresponds to the start of a data segment in the memory that is used by the test code segment;
    - wherein generating the test code segment includes:
      - storing a set of possible opcodes in a plurality of storage locations;
      - iteratively generating a pseudo-random value; and
      - after each iteration, using the resulting pseudo-random value to select an opcode from the set of possible opcodes until a number of opcodes have been selected;
  - executing the test code segment for a plurality of iterations, and after each iteration of the plurality of iterations adding a predetermined value to the memory offset;
  - saving within the memory, the data segment as a first test result of a first portion of the plurality of iterations;
  - saving within the memory, the data segment as a subsequent test result after each subsequent portion of the plurality of iterations;
  - comparing each subsequent test result with the first test result;
  - determining whether any of the subsequent test results are different than the first test result; and
  - providing a failure notification in response to determining that any of the subsequent test results are different than the first test result.

14. The system as recited in claim 13, wherein the method further comprises generating a second pseudo-random value for use in generating an operand value used during execution of the test code segment.

* * * * *